United States Patent
Akiyama (10) Patent No.: US 11,128,103 B2
(45) Date of Patent: Sep. 21, 2021

(54) MODULATED LIGHT SOURCE

(71) Applicants: FUJITSU LIMITED, Kawasaki (JP); Photonics Electronics Technology Research Association, Bunkyo-ku (JP)

(72) Inventor: Tomoyuki Akiyama, Yokohama (JP)

(73) Assignees: FUJITSU LIMITED, Kawasaki (JP); PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 422 days.

(21) Appl. No.: 14/992,342

(22) Filed: Jan. 11, 2016

(65) Prior Publication Data

US 2016/0218481 A1 Jul. 28, 2016

(30) Foreign Application Priority Data

Jan. 28, 2015 (JP) .............................. JP2015-014702

(51) Int. Cl.
*G01J 1/20* (2006.01)
*H01S 5/065* (2006.01)
(Continued)

(52) U.S. Cl.
CPC ............ *H01S 5/0656* (2013.01); *G02F 1/225* (2013.01); *G02F 1/211* (2021.01); *G02F 1/213* (2021.01);
(Continued)

(58) Field of Classification Search
CPC .... G02F 1/225; H01S 5/0656; H01S 3/10092; H01S 3/10084; H01S 5/0657; H04B 10/506; H04B 10/54; H04B 10/541
(Continued)

(56) References Cited

U.S. PATENT DOCUMENTS 8,571,084 B2 * 10/2013 Docter ................ H01S 5/06256
372/20
2002/0044574 A1 * 4/2002 Abedin ................. H01S 3/1109
372/18
(Continued)

FOREIGN PATENT DOCUMENTS

JP 2008-228267 A1 9/2008
JP 2010-050162 A 3/2010
(Continued)

OTHER PUBLICATIONS

Office Action of Japanese Patent Application No. 2015-014702 dated Aug. 21, 2018 (4 pages, 4 pages translation, 8 pages total) (machine translation).

*Primary Examiner* — Georgia Y Epps
*Assistant Examiner* — Kevin Wyatt
(74) *Attorney, Agent, or Firm* — Kratz, Quintos & Hanson, LLP (57) ABSTRACT

A modulated light source includes an FP laser that emits light in a plurality of Fabry-Perot (FP) modes, a band-pass filter whose center wavelength can be modulated, a light reflector that selectively feeds only light having passed through the modulation filter back to the FP laser, and a wavelength adjustment mechanism that adjusts the center wavelength so as to coincide with one of the predetermined FP mode when the light fed back to the FP laser is used as seed light for stimulated emission of radiation to cause selective light emission at an oscillation wavelength.

7 Claims, 13 Drawing Sheets (51) Int. Cl.
- *G02F 1/225* (2006.01)
- *H01S 5/06* (2006.01)
- *H01S 5/0687* (2006.01)
- *H01S 5/12* (2021.01)
- *G02F 1/21* (2006.01)

(52) U.S. Cl.
CPC ........... *H01S 5/0612* (2013.01); *H01S 5/0687* (2013.01); *H01S 5/12* (2013.01)

(58) Field of Classification Search
USPC ...................................................... 250/201.1
See application file for complete search history.

(56) References Cited

U.S. PATENT DOCUMENTS

| | | | |
|---|---|---|---|
| 2003/0072336 A1* | 4/2003 | Senapati | H01S 5/0687 372/32 |
| 2003/0165173 A1* | 9/2003 | Helbing | H04B 10/506 372/50.121 |
| 2004/0071399 A1* | 4/2004 | Jung | H04B 10/506 385/31 |
| 2004/0258360 A1 | 12/2004 | Lim | |
| 2005/0201675 A1* | 9/2005 | Knopp | G02B 6/12 385/27 |
| 2006/0215949 A1* | 9/2006 | Lipson | G02F 1/025 385/2 |
| 2006/0279734 A1* | 12/2006 | Yan | G02B 6/12026 356/329 |
| 2007/0274354 A1* | 11/2007 | Chi | H01S 5/02284 372/29.022 |
| 2008/0193145 A1 | 8/2008 | Yokoyama | |
| 2009/0169149 A1* | 7/2009 | Block | G02F 1/3132 385/9 |
| 2009/0175303 A1* | 7/2009 | Zhang | H04B 10/572 372/26 |
| 2010/0272135 A1* | 10/2010 | Kuksenkov | H01S 3/109 372/22 |
| 2012/0039346 A1* | 2/2012 | Liang | H01S 5/0656 372/20 |
| 2012/0189308 A1* | 7/2012 | Watanabe | H04B 10/299 398/79 |
| 2012/0243828 A1 | 9/2012 | Suzuki | |
| 2013/0010821 A1* | 1/2013 | Yokoyama | H01S 5/06258 372/28 |
| 2013/0037692 A1 | 2/2013 | Akiyama | |
| 2013/0044973 A1* | 2/2013 | Akiyama | G02F 1/0121 385/2 |
| 2015/0086151 A1* | 3/2015 | Delfyett | H01S 3/10092 385/3 |

FOREIGN PATENT DOCUMENTS

| | | |
|---|---|---|
| JP | 2012-198465 A | 10/2012 |
| JP | 2013-037281 A | 2/2013 |
| JP | 2014-78918 A1 | 5/2014 |
| WO | 2013/114578 A1 | 8/2013 |

\* cited by examiner

ASSUMPTIONS: RING RADIUS IS 5 μm, RESONATOR LENGTH IS 400 μm, AND WAVELENGTH/TEMPERATURE COEFFICIENT IS 0.07 nm/°C

| | AMOUNT OF WAVELENGTH SHIFT | AMOUNT OF TEMPERATURE INCREASE |
|---|---|---|
| RELATED ART | 19 nm (RESONANCE WAVELENGTH INTERVALS) | 271°C |
| FIRST EMBODIMENT (MODULATION FILTERING) | 0.8 nm (FP MODE INTERVALS) | 11°C |

SIGNIFICANT IMPROVEMENT IN RELIABILITY RESULTING FROM SIGNIFICANT DECREASE IN TEMPERATURE

FIG. 11

MODULATED LIGHT SOURCE

CROSS-REFERENCE TO RELATED APPLICATION

This application is based upon and claims the benefit of priority of the prior Japanese Patent Application No. 2015-014702, filed on Jan. 28, 2015, the entire contents of which are incorporated herein by reference.

FIELD

The embodiments discussed herein relate to a modulated light source.

BACKGROUND

It has been desired to develop a modulated light source that is compact and consumes a low power. In such a modulated light source, using a minute ring modulator with a silicon sub-micron optical waveguide has been studied.

Figure 11:
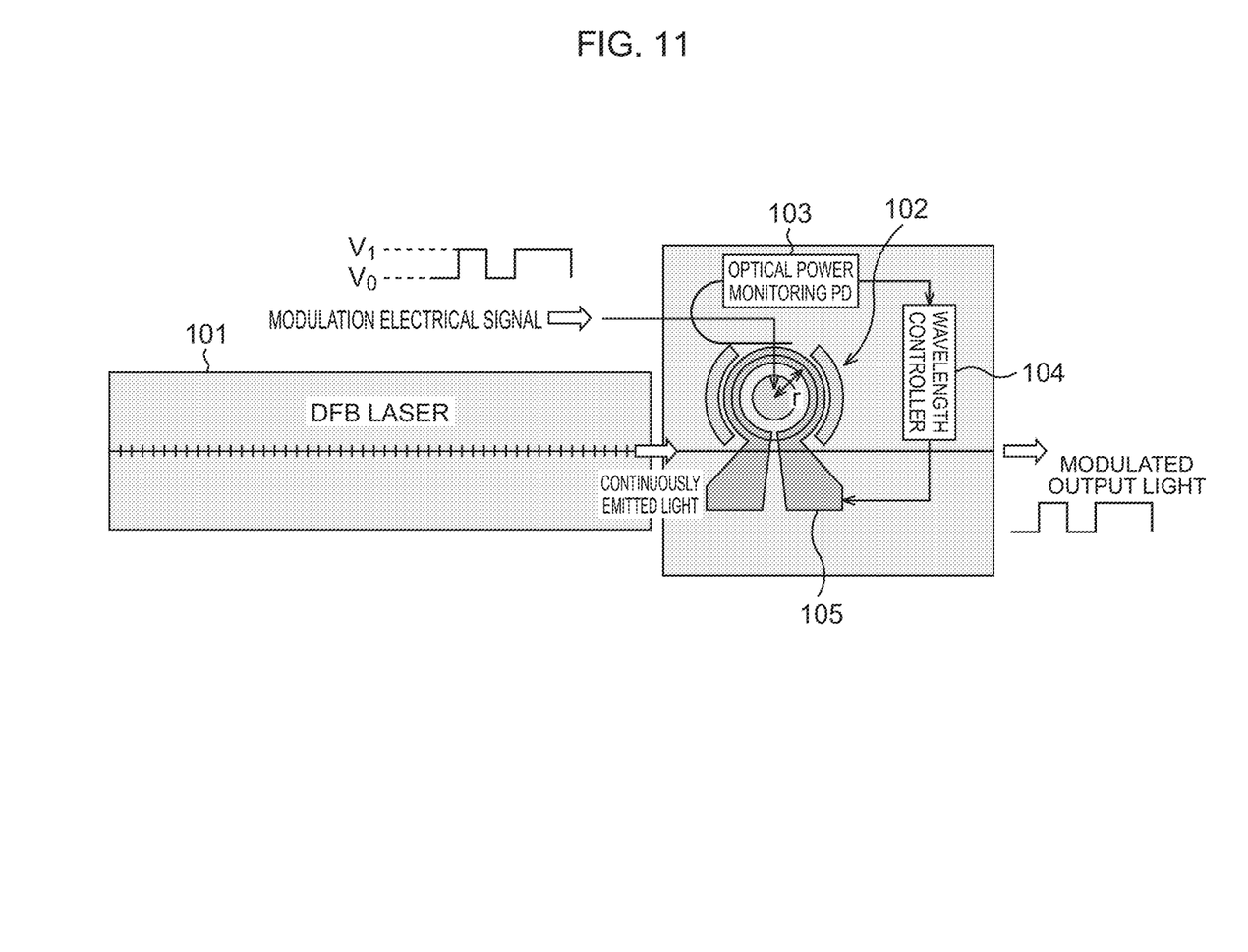
FIG. 11 is a diagrammatic view depicting a schematic configuration of a modulated light source of related art using a ring modulator.

FIG. 11 is a diagrammatic view depicting a schematic configuration of a modulated light source of related art using a ring modulator.

The modulated light source includes a distributed feedback (DFB) laser 101, a ring modulator 102, a PD 103, a wavelength controller 104, and a heater 105.

The PD 103 senses power of light having passed through the ring modulator 102. The wavelength controller 104 outputs a signal that controls the wavelength of laser light based on the optical power sensed with the PD 103. The heater 105 heats the ring modulator 102 in accordance with the control signal from the wavelength controller 104 to adjust the wavelength of the ring modulator to match the laser wavelength.

In the modulated light source, the DFB laser 101 outputs laser light in a continuous emission mode, and the laser light is guided to the ring modulator 102, which modulates the transmissivity at the laser light wavelength transmissivity.

The ring modulator 102 has a Lorentzian transmission spectrum centered at a resonance wavelength and changes the resonance wavelength in accordance with a change in a modulation signal between voltages $V_0$ and $V_1$. The transmissivity is thus modulated, whereby intensity-modulated output light is produced.

Figure 12:
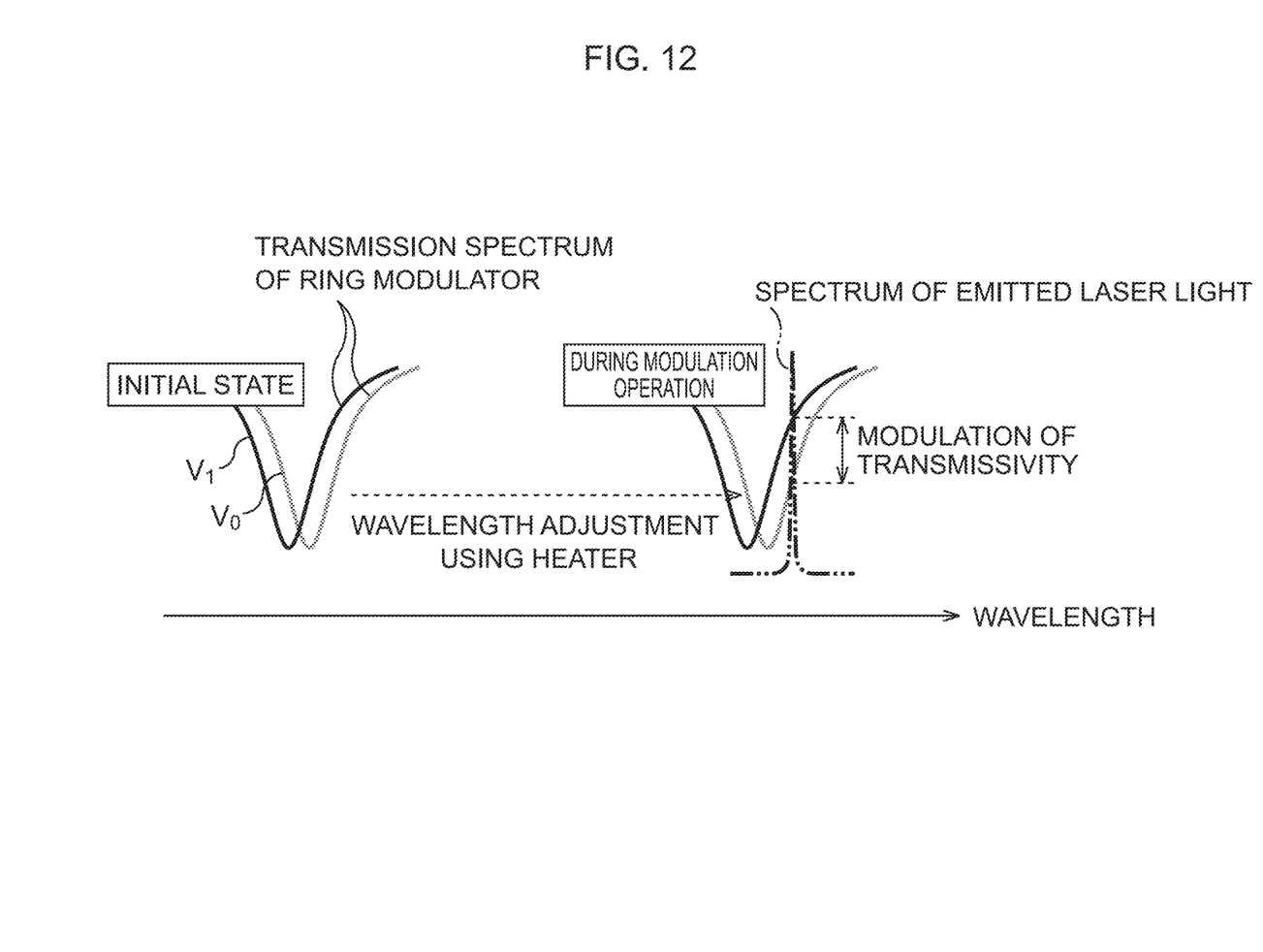
FIG. 12 is a diagram depicting how the modulated light source of related art adjusts the resonance wavelength.

The resonance wavelength of the ring modulator 102 changes as a circumference optical path length of the ring modulator 102 changes due to a manufacturing error and/or a temperature change, resulting in a discrepancy between the resonance wavelength and the wavelength of the laser light being emitted. As depicted in FIG. 12, to compensate for the discrepancy, the heater 105 heats the ring modulator 102 to raise the temperature of it for adjustment of the resonance wavelength.

Figure 13A:
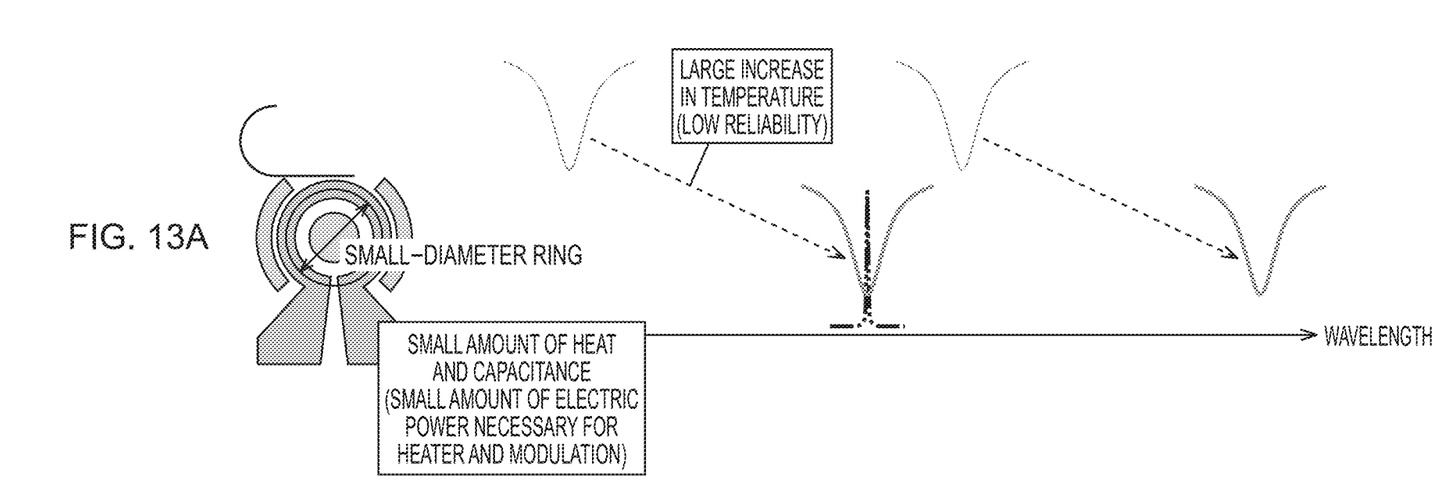
FIGS. 13A and 13B are diagrammatic views describing problems in the modulated light source of related art.

In this case, however, it is undesirably difficult not only to ensure reliability of the modulated light source but also to improve power efficiency in the wavelength adjustment mechanism and modulation operation (decrease in electric power necessary for heater and modulation operation). The reason for this is as follows:

As depicted in FIG. 13A, reducing the radius of the ring modulator 102 reduces the volume of the ring modulator 102, whereby heater power required to compensate for the wavelength shift resulting from variation in temperature is decreased. Furthermore, reducing the radius of the ring modulator 102 reduces a capacitance that serves as a load when viewed from a drive circuit of the ring modulator 102, whereby the modulation power is deceased. On the other hand, because the difference between the laser and the ring modulator wavelength amounts up to the free spectral range (FSR), an increased FSR increases the amount of required wavelength compensation, resulting in an increase in the amount of increase in the temperature of the ring modulator 102 and hence a decrease in reliability of the ring modulator.

Figure 13B:
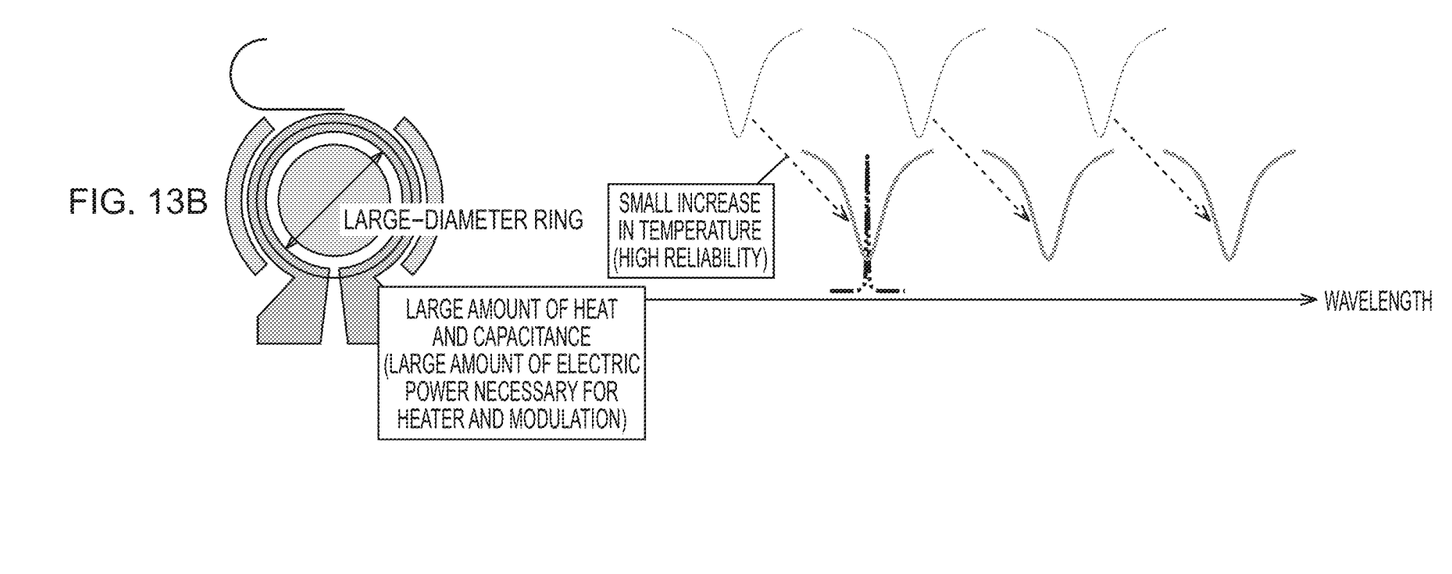

As depicted in FIG. 13B, increasing the radius of the ring modulator 102 reduces the FSR, resulting in a decrease in the amount of wavelength compensation, which reduces the amount of increase in the temperature of the ring modulator 102, whereby reliability of the ring modulator is ensured. On the other hand, the volume of the ring modulator 102 increases, resulting in increases in modulation power, and heater power required to compensate for the wavelength shift due to variation in temperature.

Furthermore, a problem caused by use of the DFB laser 101 is not negligible. That is, DFB lasers without a phase shift in the diffraction grating for improvement of power efficiency reduces a yield thereof. Conversely, introduction of a phase shift for improvement in the yield lowers the power efficiency.

Patent Document 1: Japanese Laid-open Patent Publication No. 2008-228267

Patent Document 2: Japanese Laid-open Patent Publication No. 2014-78918

SUMMARY

An aspect of a modulated light source includes an FP laser that emits light in a plurality of Fabry-Perot modes, a band-pass filter whose center wavelength can be modulated, a light reflector that selectively feeds only light having passed through the modulation filter back to the FP laser, and a wavelength adjustment mechanism that adjusts the center wavelength of the band-pass filter so as to coincide with one of the predetermined Fabry-Perot modes when the light fed back to the FP laser is used as seed light for stimulated emission to cause selective light emission at an oscillation wavelength.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Preferable embodiments of a modulated light source will be described below in detail with reference to the drawings.

First Embodiment

Figure 1:
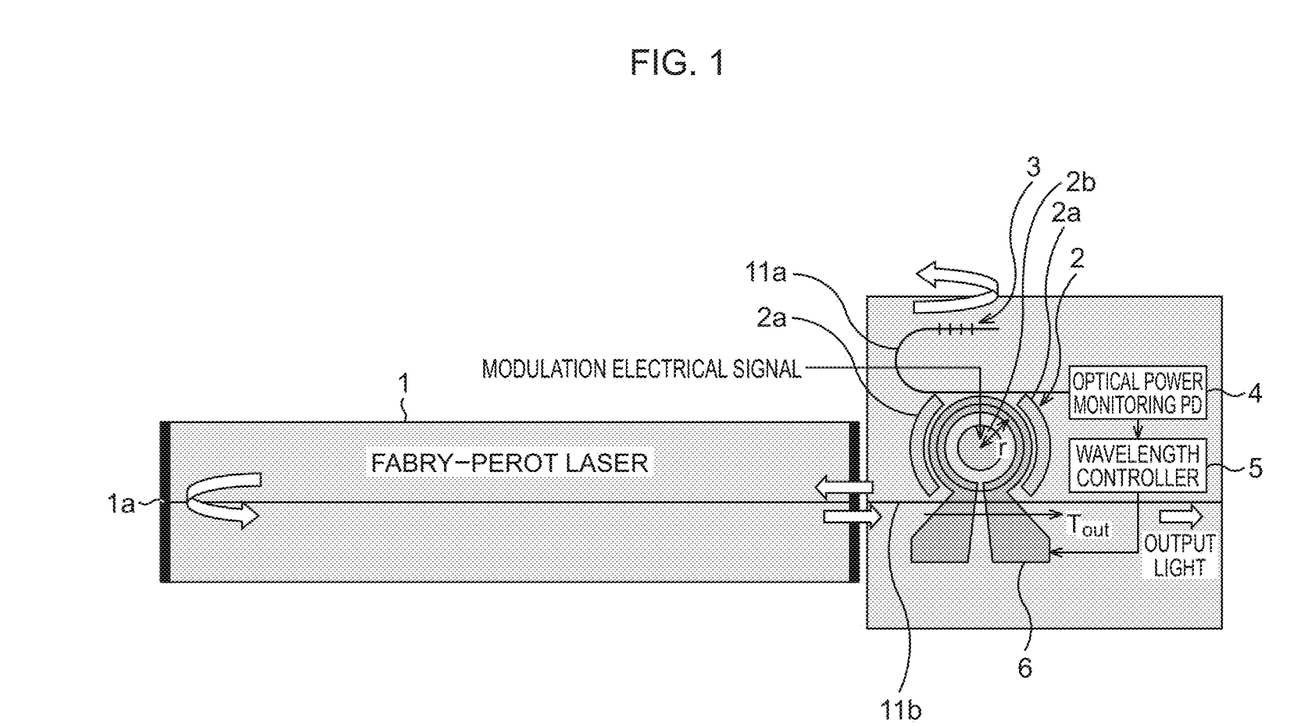
FIG. 1 is a diagrammatic view depicting a schematic configuration of a modulated light source according to a first embodiment.

FIG. 1 is a diagrammatic view depicting a schematic configuration of a modulated light source according to a first embodiment.

The modulated light source includes a Fabry-Perot (FP) laser 1, a ring modulator 2, a distributed Bragg reflector (DBR) mirror 3, a photodiode (PD) 4, a wavelength controller 5, and a heater 6.

The FP laser 1 is a laser that emits light in a plurality of Fabry-Perot (FP) modes having a predetermined wavelength interval. The FP laser 1 contains a semiconductor, for example, InGaAsP, and has one waveguide end on which a highly reflective (HR) film 1a is formed. The other end of the waveguide in the FP laser 1 is simply a cleaved surface on which no film is formed, or a film that adjusts reflectivity is formed on the other end, which therefore has reflectivity lower than that of the HR film 1a.

The ring modulator 2 is a band-pass filter and is formed, for example, of a silicon wire. In the ring modulator 2, a P-type doped region and an N-type doped region are provided in a ring-shaped optical waveguide, and electrodes 2a and 2b are disposed for modulating the resonance wavelength based on the modulation signal and in accordance with the intensity thereof.

The ring modulator 2 changes the refractive index of the optical waveguide to modulate the resonance wavelength by a reverse bias or a forward bias voltage applied by the electrodes between the P-type doped region and the N-type doped region.

The ring modulator 2 has optical waveguides 11a and 11b, each of which is formed, for example, of a silicon wire. The optical waveguide 11a has one end on which the DBR mirror 3 is disposed and the other end on which the PD 4 is disposed. The optical waveguide 11b has one end that serves as an optical signal output port and the other end that is butt-jointed to the FP laser 1.

The DBR mirror 3 is formed of a diffraction grating and feeds only light having passed through the ring modulator 2 back through the other end of the optical waveguide 11b to the FP laser 1 as seed light for stimulated emission.

The PD 4 senses the power of the light having passed through the ring modulator 2.

The wavelength controller 5 outputs a signal that controls the wavelength of the ring modulator 2 based on the optical power sensed with the PD 4. The position where the PD 4 is disposed is not limited to the position in FIG. 1 and may be any position along the optical waveguide.

The heater 6 heats the ring modulator 2 in accordance with the signal from the wavelength controller 5 to adjust the ring resonance wavelength.

A wavelength adjustment mechanism includes PD 4, wavelength controller 5, and heater 6. In the selective light emission at a predetermined oscillation wavelength, the wavelength adjustment mechanism adjusts the resonance wavelength in such a way that it coincides with the specific oscillation wavelength.

Figure 2:
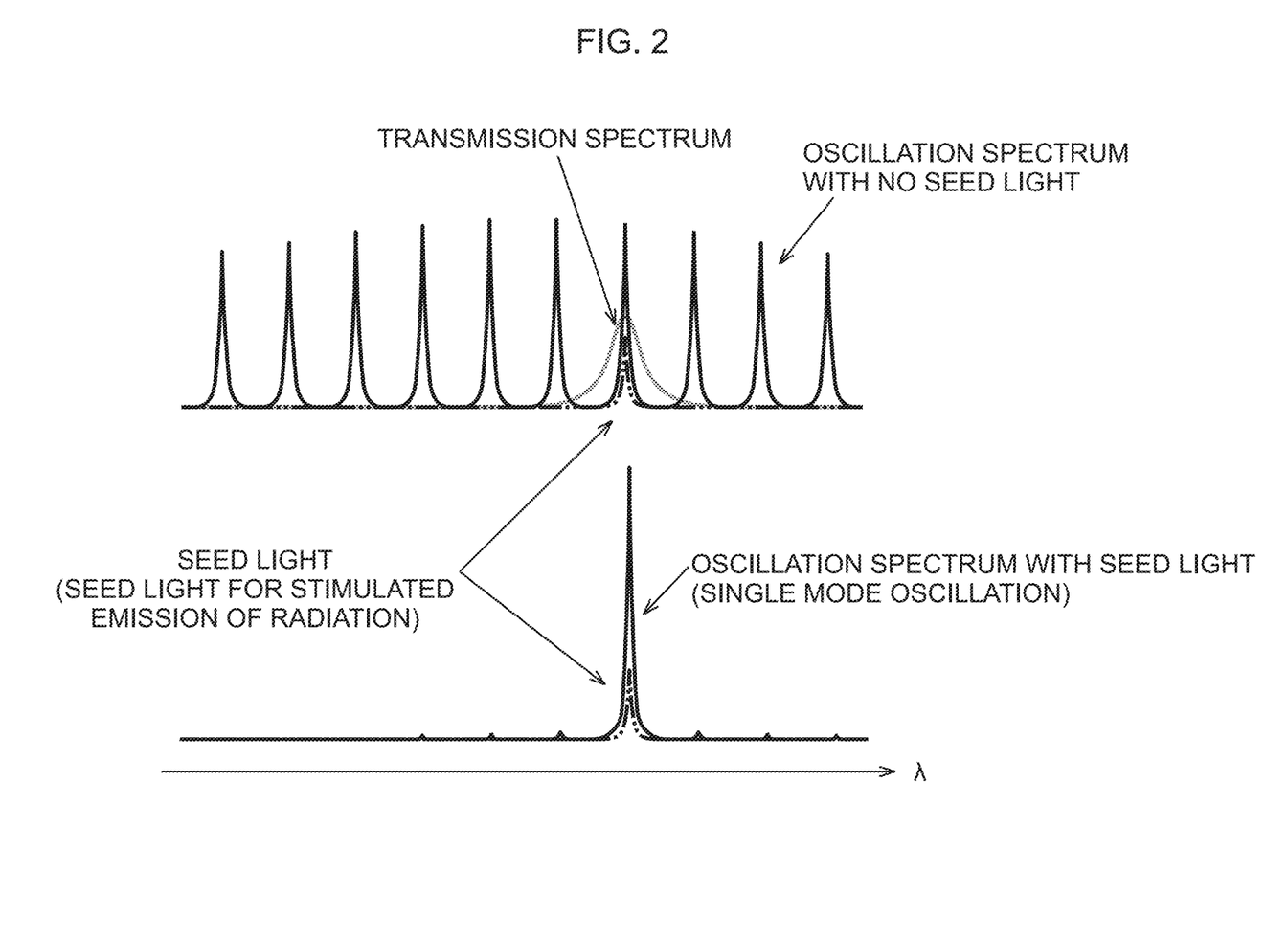
FIG. 2 is a diagram depicting the relationship between a resonance wavelength spectrum and an emitted light spectrum in the case where the resonance wavelength coincides with the emitted light wavelength.

In the modulated light source according to the present embodiment, as depicted in FIG. 2, the FP laser 1 causes laser oscillation in a plurality of FP modes having a predetermined wavelength interval. The ring modulator 2, which is a band-pass filter, has a transmission spectrum, for example, indicated by the arrow in FIG. 2. Among emitted lights corresponding to the plurality of FP modes, an emitted light in the transmission spectrum is selectively fed back as a seed light to the FP laser 1. As a result, only an FP mode in the vicinity of the resonance wavelength of the ring modulator 2 selectively starts oscillation, and the FP laser 1 selectively lases in a single longitudinal mode. In accordance with the modulation signal inputted to the ring modulator 2, the emitted light is intensity-modulated and is outputted through the output port of the optical waveguide 11b.

Figure 3A:
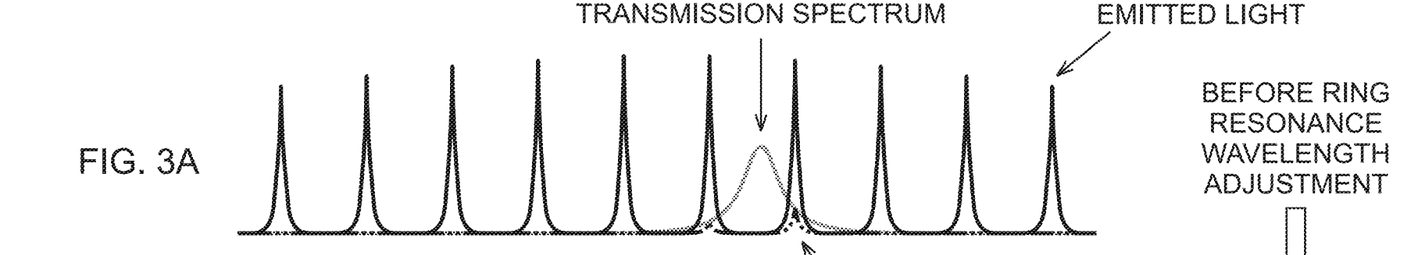
FIGS. 3A to 3C are diagrams depicting how an initial wavelength discrepancy is compensated.
Figure 3B:
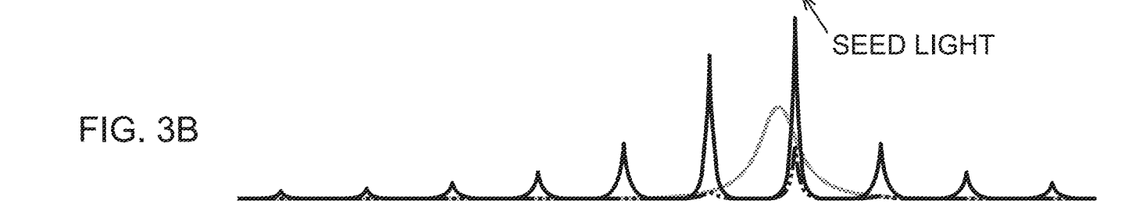
Figure 3C:
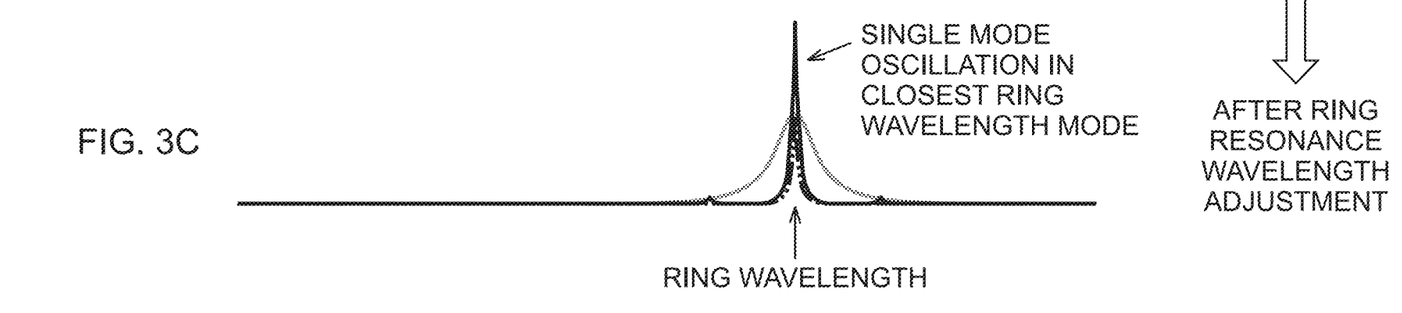

As depicted in FIG. 3A, the transmission peak of the ring modulator 2 does not necessarily coincide with the wavelength of any FP modes in an initial state, and wavelength adjustment is therefore necessary. The heater 6 can raise the temperature of the ring modulator 2 to shift the transmission peak of the ring modulator 2 toward a longer wavelength. As depicted in FIG. 3B, when the heater 6 is so driven that the wavelength of the transmission peak approaches the wavelength of one FP mode, the power of the FP mode is selectively increased. As depicted in FIG. 3C, at a point where the wavelength at the transmission peak exactly coincides with the wavelength in the FP mode, oscillation occurs in a single FP mode. As described above, in the present embodiment, the transmission peak of the ring modulator 2 only needs to coincide with one of the plurality of FP modes, whereby the amount of adjustment of the transmission peak is roughly equal to the wavelength interval between the FP modes at the maximum.

Figure 4:
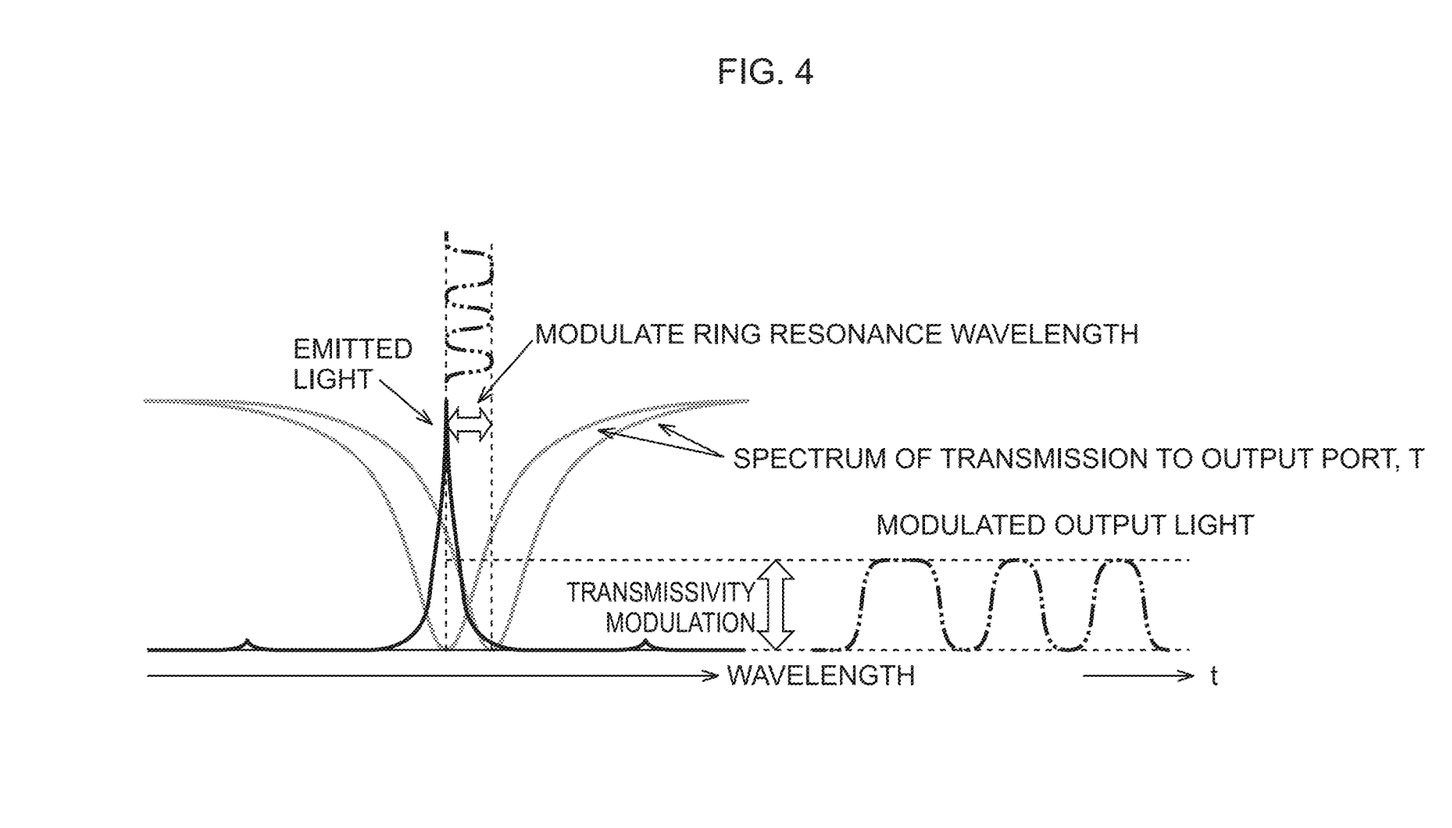
FIG. 4 is a diagram depicting how the light is modulated.

As depicted in FIG. 4, applying a digital modulation signal that changes between voltages $V_0$ and $V_1$ to the electrodes 2a and 2b of the ring modulator 2 allows the resonance wavelength to be modulated in accordance with the intensity of the modulation signal. Transmissivity, T to the output port at the wavelength of the emitted light can thus be modulated. The transmissivity modulation allows the power $P_{out}$ of the output light to be modulated in correspondence with the modulation signal.

Figure 5A:
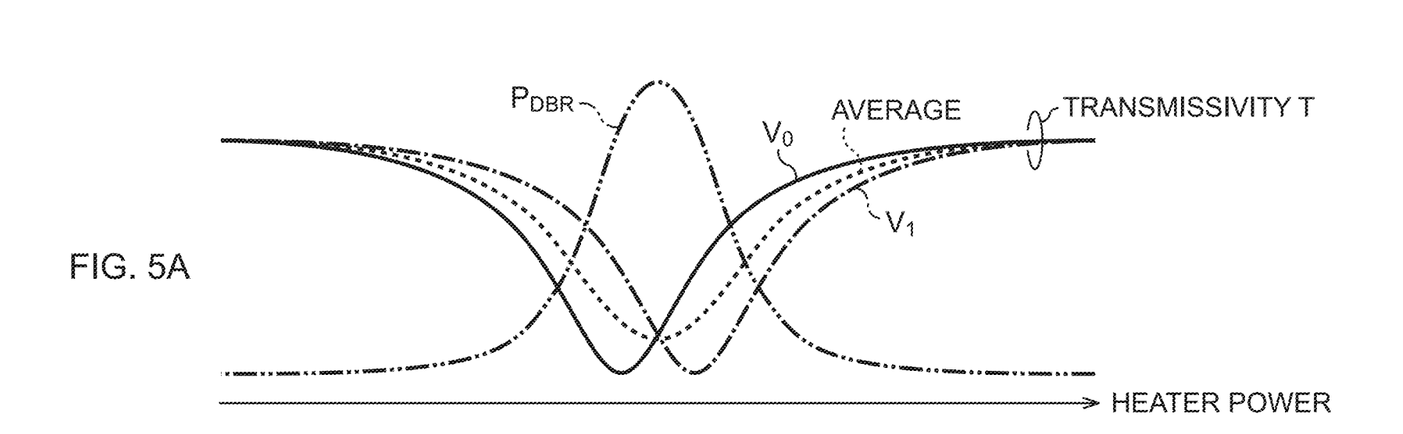
FIGS. 5A and 5B are diagrams describing a wavelength control method.

As depicted in FIG. 5A, when the power of the heater 6 is increased, the resonance wavelength of the ring modulator 2 is shifted toward a longer wavelength, and the transmissivity, T is locally minimized at a point where the center wavelength coincides with the oscillation wavelength of the FP laser 1. When the power of the heater 6 is further increased, the resonance wavelength goes away from the oscillation wavelength and the transmissivity, T increases. When a voltage signal modulated between the levels of $V_0$ and $V_1$ is applied to the electrodes of the ring modulator 2, the resonance wavelength is also modulated in accordance with the voltage signal. Time-averaged transmissivity T is approximately the average of the transmissivity at the voltages $V_0$ and $V_1$, as depicted by a dotted line labeled with "average" in FIG. 5A. Here, the transmissivity at the voltage $V_0$ is represented by a solid line and the transmissivity at the voltage $V_1$ is represented by a dot dash line. Since the transmissivity between the optical waveguides of the ring modulator 2 is an upside-down of the transmissivity T, time-average optical power $P_{DBR}$ is represented by a double dot dash line in FIG. 5A. That is, the optical power $P_{DBR}$ follows a unimodal curve being maximized at the minimum of the curve of the "average" transmissivity.

Figure 5B:
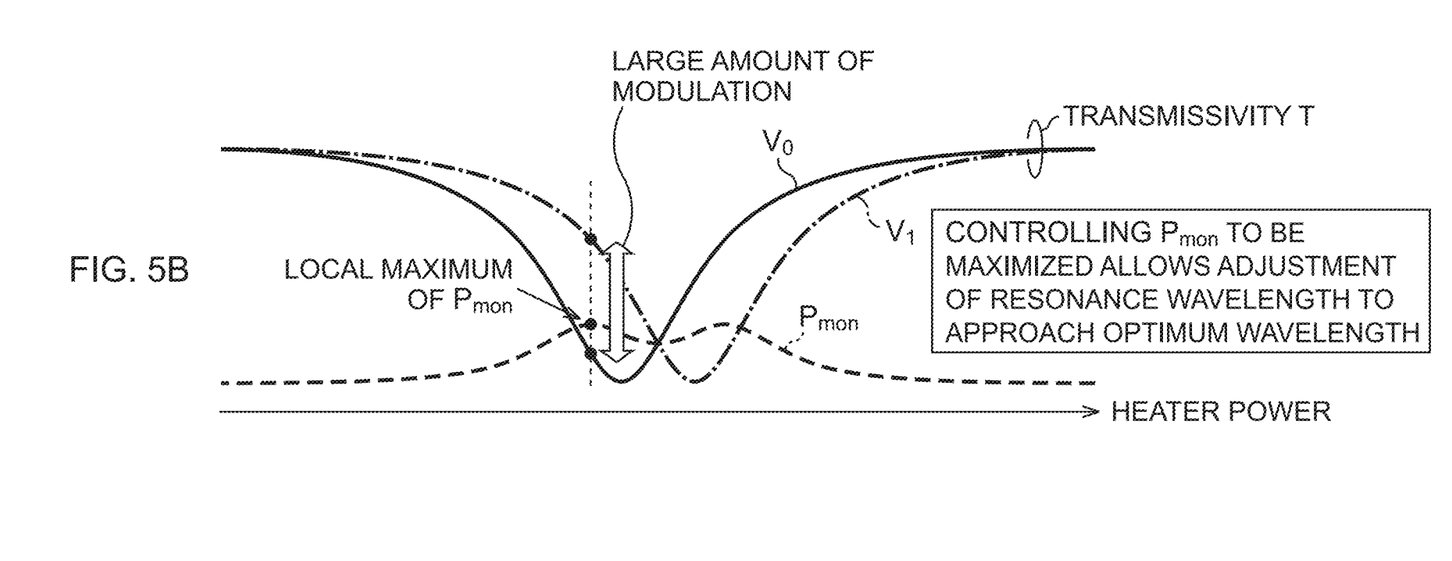

Time-average power $P_{mon}$, which is obtained by multiplying the time-average power $P_{DBR}$ depicted in FIG. 5A by the "average" transmissivity, follows a bimodal curve, as indicated by the dashed line in FIG. 5B. In this case, a local maximum of the $P_{mon}$ is a point where the transmissivity T undergoes a large amount of modulation resulting from the modulation between the voltages $V_0$ (solid line) and $V_1$ (dot dash line). That is, monitoring the time-average power $P_{DBR}$ at a speed sufficiently slower than that of the modulation and controlling the power of the heater 6 so that the time-average power $P_{DBR}$ be maximized allow the resonance wavelength of the ring modulator 2 to be adjusted to a wavelength suitable for the modulation.

Figure 6A:
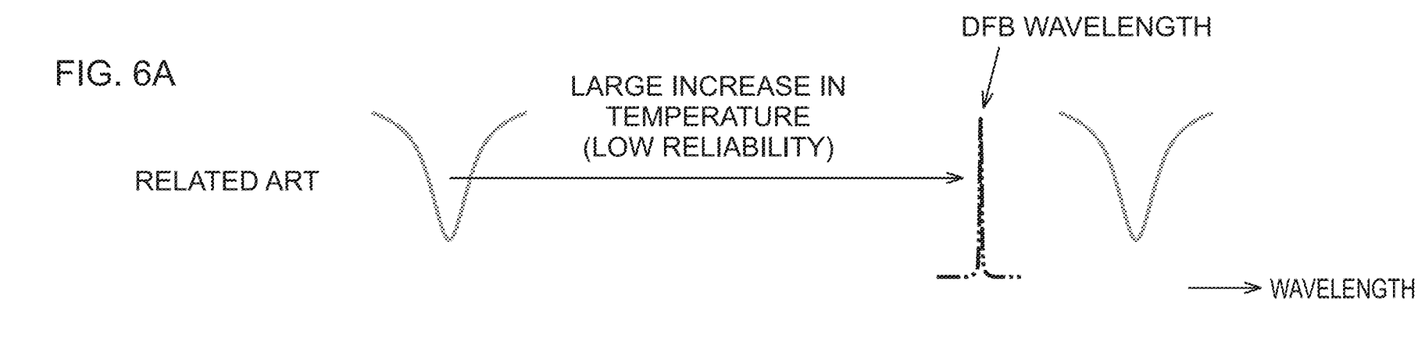
FIGS. 6A and 6B are diagrams depicting required increases in temperatures to for the related art and the first embodiment.

In the ring modulator 2 using optical waveguides each formed of a silicon wire, the ring radius, r can be reduced to about 5 μm without a significant increase in the bending loss, and the electric power necessary for the modulation and the electric power consumed by the heater 6 can be lowered as the ring radius, r decreases. In the case that the ring radius is 5 μm, the free spectral range (FSR) becomes about 19 nm. In this case, a wavelength shift of about 19 nm is required at the maximum in the related art as depicted in FIG. 6A.

Figure 6B:
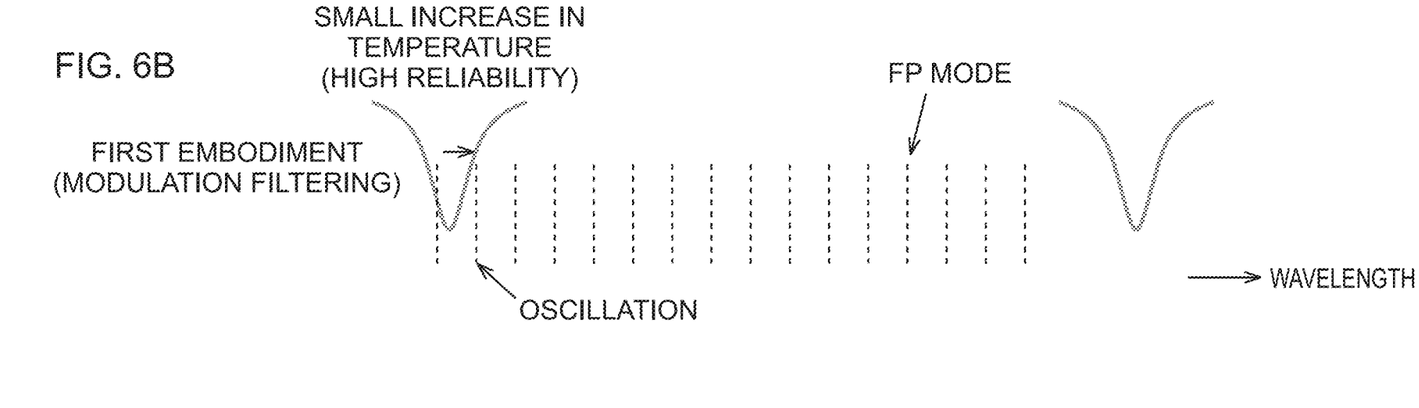
Figure 7:
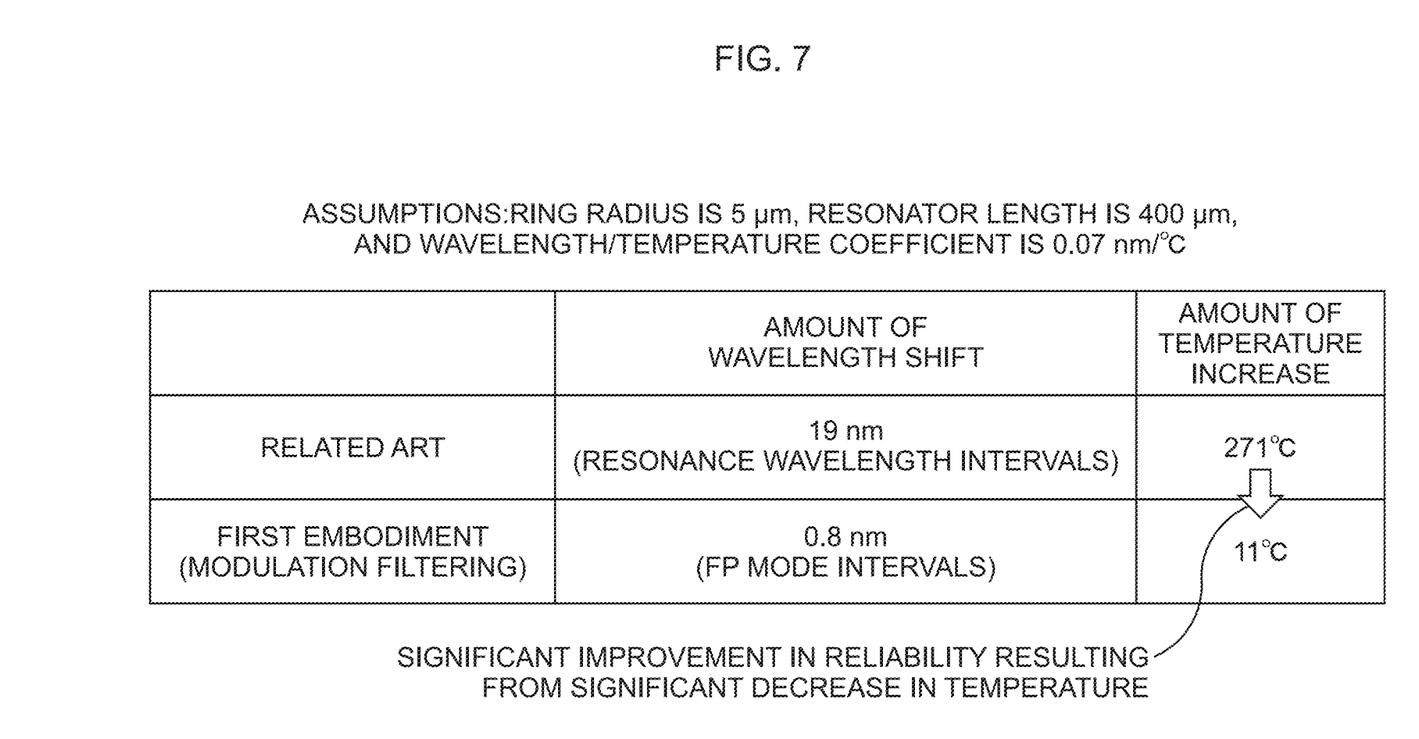
FIG. 7 is a table depicting the amount of wavelength shift and the amount of temperature increase required for wavelength matching between the laser and the ring modulator.

In contrast, in the present embodiment, in which the resonator length of the FP laser 1 is set at about 400 μm, the FSR is about 0.8 nm. In this case, as depicted in FIG. 6B, the amount of wavelength shift compensation is 0.8 nm at the maximum. As depicted in FIG. 7, when the amount of wavelength shift compensation is converted into temperature by using a wavelength-temperature coefficient of 0.07 nm/K for an optical waveguide formed of a silicon wire, it is necessary to increase the temperature by 271° C. in related art. In contrast, in the present embodiment, an increase in temperature is only 11.4° C., resulting in a significant improvement in reliability as compared with related art. The power consumed by the heater can also be reduced to about 0.8 nm/19 nm×100≈4.2%.

EXAMPLE

A specific example of the modulated light source according to the present embodiment will be described below.

In the present example, the FP laser is configured as follows: The FP laser comprises an InGaAsP; an HR coat having a reflectivity of about 98% formed on the waveguide edge of the FP laser on the side away from the Si photonic integrated circuit (PIC); and the as-cleaved waveguide edge of the FP laser having a reflectivity of about 30% on the side facing the Si PIC. The FP laser having a resonator length of about 400 μm is flip-chip mounted on a terrace of an SOI substrate, and is butt-jointed to a silicon sub-micron optical waveguide formed by processing the SOI layer of the SOI substrate to achieve optical coupling. The silicon sub-micron optical waveguide, to which the FP laser is optically coupled, has a ring modulator having a radius of about 5 μm.

In addition to the input/output waveguide coupled to the FP laser, an additional input/output waveguide is provided. A DBR mirror made of a diffraction grating having a reflectivity of about 50% is formed on one end of the additional input/output waveguide. A PD is provided on the other end of the additional input/output waveguide. A wavelength controller outputs a signal that controls the wavelength of the ring modulator based on the optical power sensed with the PD. A shift of the wavelength of the ring modulator is produced by a current outputted from the wavelength controller to the heater.

Figure 8:
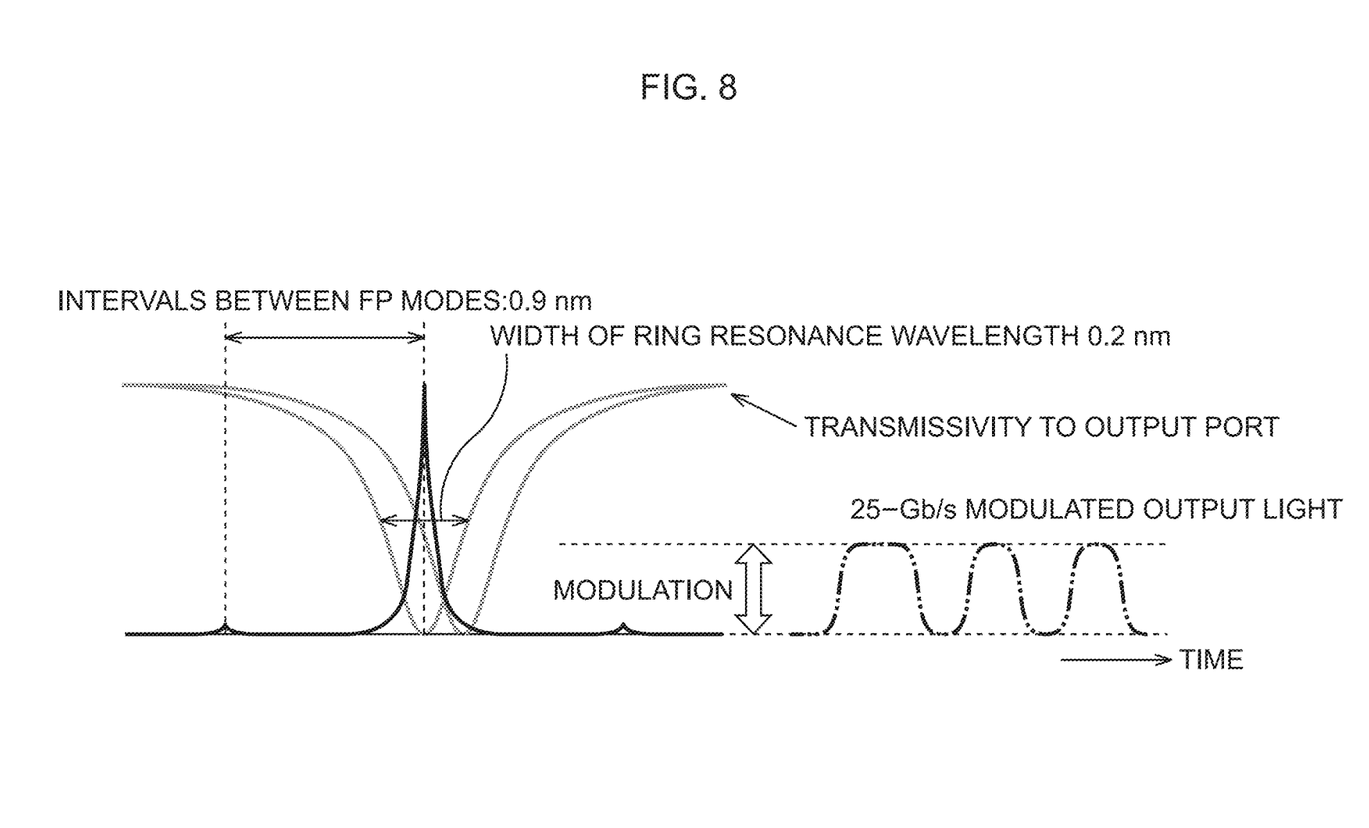
FIG. 8 is a diagram depicting how the light is modulated.

As depicted in FIG. 8, by setting the resonator length of the FP laser to be about 400 μm, the interval between the FP modes become about 0.9 nm. In this case, when the full width at the half maximum (FWHM) of the ring resonance wavelength is set at about 0.2 nm, only one of the FP modes can be fed back as a seed light to the FP laser. When the FWHM of the ring resonance wavelength is set to be about 0.2 nm, the ring modulator can provide a modulation band up to about 25 GHz.

According to the aspects described above, an excellent, minute modulated light source meets the two requirements at the same time, one of which is to ensure the reliability of the modulated light source and the other of which is to improve power efficiency in the wavelength adjustment mechanism.

Second Embodiment

In the second embodiment, a modulated light source is disclosed as in the first embodiment, but the disclosed modulated light source differs from the modulated light source according to the first embodiment in that it is a multi-wavelength modulated light source.

Figure 9:
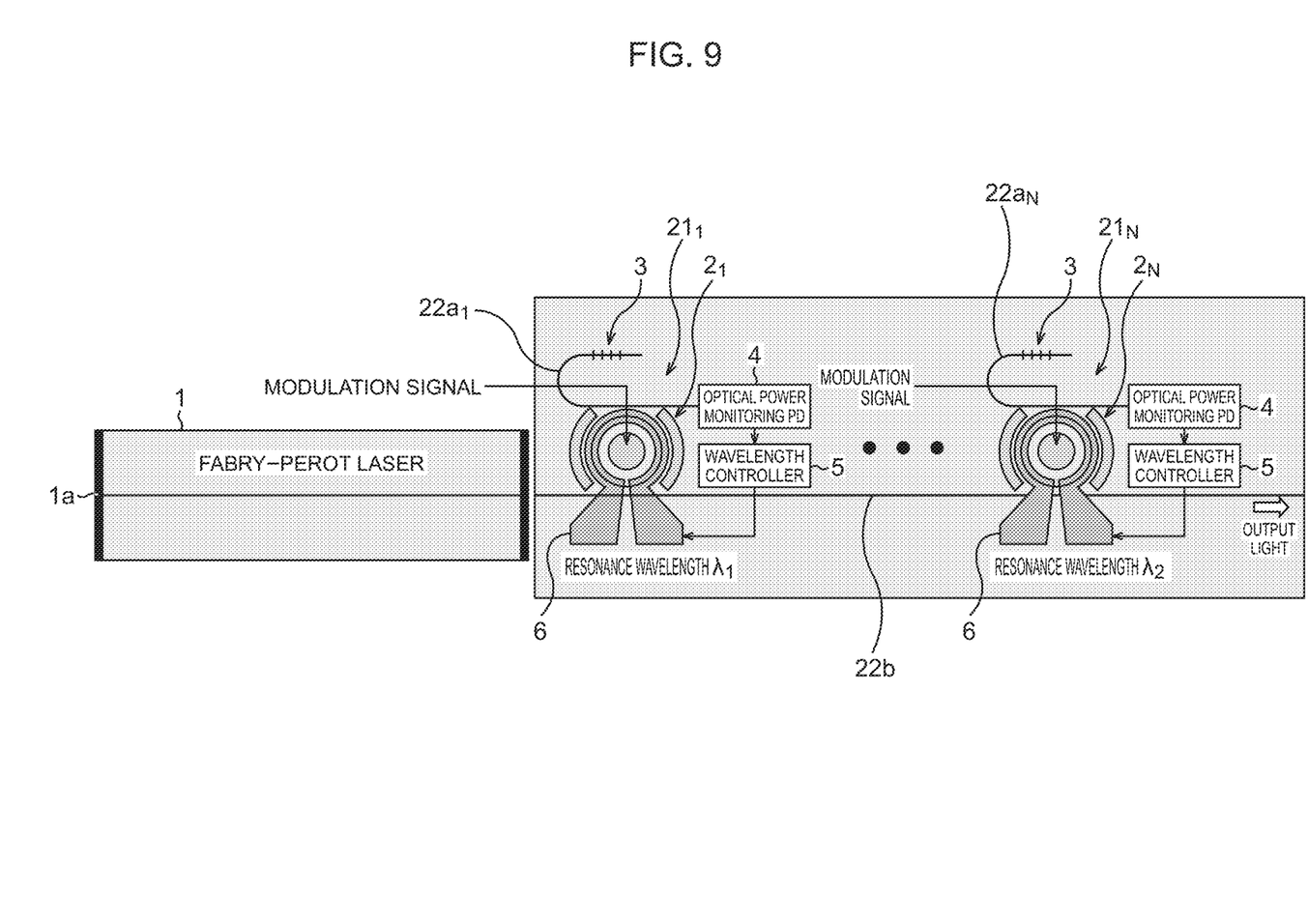
FIG. 9 is a diagrammatic view depicting a schematic configuration of a modulated light source according to a second embodiment.

FIG. 9 is a diagrammatic view depicting a schematic configuration of the modulated light source according to the second embodiment. The constituent members and other components corresponding to those in the first embodiment have the same reference characters as those in FIG. 1 and will not be described in detail.

The modulated light source includes the FP laser 1 and a plurality of light modulation units $21_1$ to $21_N$ (N≥2).

The light modulation unit $21_k$ (1≤k≤N) includes a ring modulator $2_k$, which is a band-pass filter, a DBR mirror 3, which is a light reflector, a PD 4, which is an optical power sensor, a wavelength controller 5, and a heater 6.

Each of the ring modulators $2_1$ to $2_N$ have an optical waveguide having a DBR as denoted by $22_{a1}$ to $22_{aN}$, respectively each of which is formed, for example, of a silicon wire. The ring modulators $2_1$ to $2_N$ share an optical waveguide $22b$ also made of a silicon wire. One end of the optical waveguides $22_{a1}$ to $22_{aN}$ has DBR mirrors 3, and the other end of said optical waveguides have PDs 4. The optical waveguide $22b$ has one end that serves as an optical signal output port and the other end that is butt-jointed to the FP laser 1.

The position where each of the PDs 4 is disposed is not limited to the position in FIG. 9 and may be any position along the corresponding optical waveguide.

In the modulated light source according to the present embodiment, the FP laser 1 causes laser oscillation in a plurality of FP modes having a predetermined wavelength interval. The N ring modulators $2_1$ to $2_N$, each of which is a band-pass filter, are disposed. The ring modulators $2_1$ to $2_N$ have resonance wavelengths $\lambda_1, \lambda_2, \ldots, \mu_N$ different from one another and have transmission peaks in the vicinities of the resonance wavelengths $\lambda_1, \lambda_2, \ldots, \lambda_N$. The DBR mirrors 3 in the ring modulators $2_1$ to $2_N$ therefore allow only light beams in the vicinities of the resonance wavelengths $\lambda_1$, $\lambda_2$, ... $\lambda_N$ to be fed back as a seed light to the FP laser 1. As a result, FP modes in the vicinities of the resonance wavelengths $\lambda_1$, $\lambda_2$, ... $\lambda_N$ can be oscillated and intensity-modulated at the same time. The configuration described above achieves a multi-wavelength modulated light source.

As described above, according to the aspects described above, an excellent, minute modulated light source satisfies the two requirements at the same time, one of which is to ensure the reliability of the modulated light source and the other of which if to improve power efficiency in the wavelength adjustment mechanism.

Third Embodiment

In the third embodiment, a modulated light source is disclosed as in the first embodiment, but the disclosed modulated light source differs from the modulated light source according to the first embodiment in that it is a multi-wavelength modulated light source.

Figure 10:
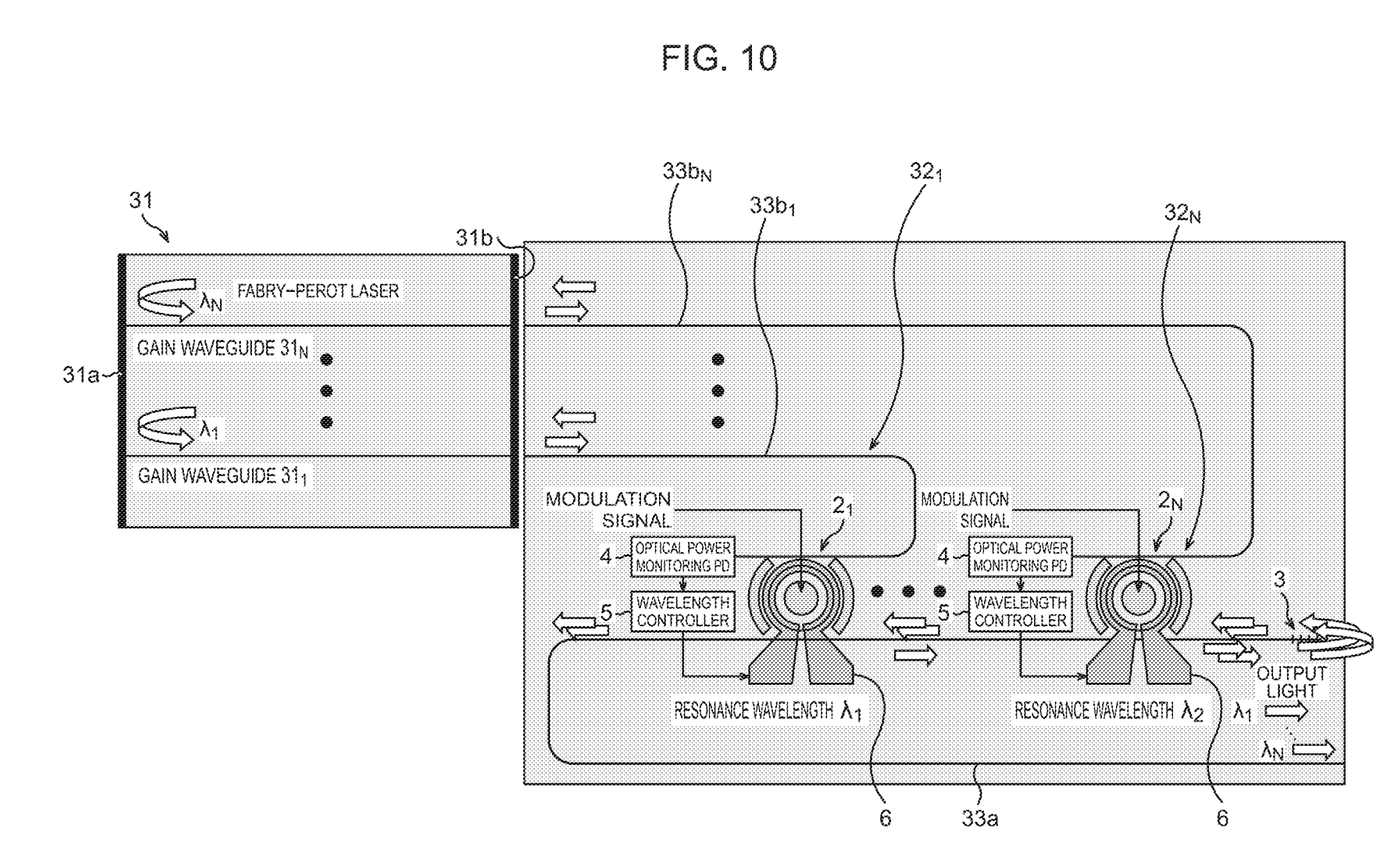
FIG. 10 is a diagrammatic view depicting a schematic configuration of a modulated light source according to a third embodiment.

FIG. 10 depicts a configuration of the modulated light source according to the third embodiment. The constituent members and other components corresponding to those in the first embodiment have the same reference characters as those in FIG. 1 and will not be described in detail.

The modulated light source includes an FP laser 31 and a plurality of light modulation units $32_1$ to $32_N$ (N≥2).

The FP laser array chip 31 is configured as follows: The chip 31 comprises a semiconductor, such as InGaAsP; a plurality of gain waveguides $31_1$ to $31_N$; and a highly reflection (HR) film 31a formed on one end of the FP laser array chip 31. No film is formed on the other end of the FP laser array chip 31, or a reflectivity adjustment film is formed thereon, so that the other end has reflectivity lower than that of the HR film 31a. The gain waveguides $31_1$ to $31_N$ are butt-jointed to the light modulation units $32_1$ to $32_N$, respectively.

The light modulation unit $32_k$ (1≤k≤N) includes a ring modulator $2_k$, which is a band-pass filter, a PD 4, which is an optical power sensor, a wavelength controller 5, and a heater 6. The light modulation units $32_1$ to $32_N$ are provided with a common DBR mirror 3.

The positions where the optical power monitoring PDs 4 are disposed are not limited to the positions in FIG. 10 and may be any position along the corresponding optical waveguides.

The ring modulators $2_1$ to $2_N$ have one optical waveguide 33a and N optical waveguides $33_{b1}$ to $33_{bN}$, each of which is formed, for example, of a silicon wire. The optical waveguide 33a has one end on which the common DBR mirror 3 is disposed and the other end that serves as an optical signal output port. Each of the optical waveguides $33_{b1}$ to $33_{bN}$ has one end that is butt-jointed to the corresponding one of the gain waveguides $31_1$ to $31_N$ of the FP laser 31 and the other end on which the PD 4 is disposed.

In the modulated light source according to the present embodiment, the gain waveguides $31_1$ to $31_N$ in FP laser 31 cause laser oscillation in a plurality of FP modes having a predetermined wavelength interval. The N ring modulator $21_k$ (1≤k≤N), which is a band-pass filter, is coupled to the gain waveguide $31_k$ (1≤k≤N) in FP laser 31. The ring modulators $21_1$ to $21_N$ have resonance wavelengths $\lambda_1$, $\lambda_2$, ..., $\lambda_N$ different from one another and have transmission peaks in the vicinities of the resonance wavelengths $\lambda_1$, $\lambda_2$, ..., $\lambda_N$. The DBR mirror 3 therefore allows only light beams in the vicinities of the resonance wavelengths $\lambda_1$, $\lambda_2$, ... $\lambda_N$ to be fed back as the seed light to the gain waveguides $31_1$ to $31_N$ in the FP laser array chip 31. That is, different FP lasers are used for the resonance wavelengths $\lambda_1, \lambda_2, \ldots, \lambda_N$. As a result, FP modes in the vicinities of the resonance wavelengths $\lambda_1, \lambda_2, \ldots \lambda_N$ can be oscillated and intensity-modulated at the same time. In the present embodiment, the different gain waveguides $31_1$ to $31_N$ are used for the resonance wavelengths $\lambda_1, \lambda_2, \ldots, \lambda_N$ to achieve a multi-wavelength modulated light source in a stable oscillation state.

As described above, according to the aspects described above, an excellent, minute modulated light source meets the two requirements at the same time, one of which is to ensure the reliability of the modulated light source and the other of which is to improve power efficiency in the wavelength adjustment mechanism.

In the first to third embodiments described above, a ring modulator is exemplified as a band-pass filter, but the band-pass filter is not limited to a ring modulator. For example, a diffraction grating may be used instead of the ring modulator. The band-pass filter may instead be a cascaded Mach-Zehnder grating, an arrayed waveguide grating (AWG), or an Echelle grating or may still instead be a plurality of ring modulators coupled with each other to achieve a steeper band-pass characteristic. Any band-pass filter capable of modulation of a transmission wavelength can also be used.

Furthermore, a DBR mirror formed of a diffraction grating is exemplified as the light reflector, but the light reflector is not limited to a DBR mirror and may be any component having reflectivity over a wavelength range wide enough to tolerate variation in the wavelength of the band-pass filter. For example, the light reflector may instead be a loop mirror, a mirror using an optical waveguide end surface, or a mirror using an optical waveguide end surface on which a metal film or a dielectric multilayer film is formed for enhanced reflectivity.

Further, a heater is exemplified as part of the wavelength adjustment mechanism, but the wavelength adjustment mechanism does not necessarily include a heater, and methods of applying current to the forward direction through a PN or PIN junction and applying a reverse bias voltage thereto, as in a band-pass filter, may be employed. In this case, the ring modulator has two portions. One of the portions is used as an intensity modulation region including a pair of first electrodes that modulates the resonance wavelength based on a modulation signal and in accordance with the intensity thereof. The other portion is used as a wavelength adjustment region including a pair of second electrodes to which a wavelength modulation control signal is inputted.

According to the aspects described above, an excellent, minute modulated light source meets the two requirements at the same time, one of which is to ensure the reliability of the modulated light source and the other of which is to improve power efficiency in the wavelength adjustment mechanism.

All examples and conditional language provided herein are intended for the pedagogical purposes of aiding the reader in understanding the invention and the concepts contributed by the inventor, and are not to be construed as limitations to such specifically recited examples and conditions, nor does the organization of such examples in the specification relate to a showing of the superiority and inferiority or the invention. Although one or more embodiments of the present invention have been described in detail, it should be understood that the various changes, substitutions, and alterations could be made hereto without departing from the spirit and scope of the invention.

What is claimed is:

1. A modulated light source comprising:
   an FP laser that emits light in a plurality of Fabry-Perot modes having a predetermined wavelength interval;
   a band-pass filter;
   a light reflector that selectively feeds only light having passed through the band-pass filter back to the FP laser;
   a first wavelength adjustment mechanism that adjusts a resonance wavelength of the band-pass filter by applying a voltage modulated between a first voltage and a second voltage to modulation electrodes of the band-pass filter;
   an optical power monitor that monitors an optical power that has passed through the band-pass filter at a speed slower than a modulation speed; and
   a second wavelength adjustment mechanism having a heater for heating the band-pass filter based on a monitor result of the optical power monitor and adjusting the resonance wavelength of the modulation filter to a wavelength suitable for a modulation; wherein
   the second wavelength adjusting mechanism controls a temperature of the band-pass filter by using the heater so that a time-average of the optical power becomes a maximum value.

2. The modulated light source according to claim 1,
   wherein the band-pass filter has a transmission bandwidth enough to be capable of selecting one of the plurality of Fabry-Perot modes, and
   a light emission occurs at an oscillation wavelength in a single Fabry-Perot mode.

3. The modulated light source according to claim 1,
   wherein the band-pass filter has a first optical waveguide and a second optical waveguide,
   the first optical waveguide being coupled to the band-pass filter has an end at which the light reflector is disposed, and
   the second optical waveguide has an end serving as an output port and another end being coupled to the FP laser.

4. The modulated light source according to claim 1, further comprising a plurality of light modulation units each comprising the band-pass filter, the light reflector, the first wavelength adjustment mechanism, and the second wavelength adjustment mechanism,
   wherein the plurality of light modulation units are so configured that,
   center wavelengths of the band-pass filters differ from one another, and
   each of the second wavelength adjustment mechanisms adjusts the center wavelength so as to coincide with one of the predetermined Fabry-Perot modes.

5. The modulated light source according to claim 1, further comprising a plurality of light modulation units each comprising the band-pass filter, the first wavelength adjustment mechanism, and the second wavelength adjustment mechanism
   wherein the plurality of light modulation units are so configured that,
   the FP laser comprises a plurality of light amplification waveguides,
   each of the band-pass filters couples to the light amplification waveguide, and center wavelengths differ from one another, and
   each of the second wavelength adjustment mechanisms adjusts the center wavelength so as to coincide with one of the predetermined Fabry-Perot modes.

6. The modulated light source according to claim 5,
   wherein the light reflector is provided as a common light reflector for the plurality of light modulation units.

7. The modulated light source according to claim 5, further comprising a first optical waveguide and a plurality of second optical waveguides,
   wherein the first optical waveguide has an end at which the light reflector is disposed and another end that serves as an output port, and
   each of the second optical waveguides is coupled to the band-pass filter and has an end that is coupled to the light amplification waveguide.

* * * * *